(12) United States Patent
Kumagai et al.

(10) Patent No.: US 8,882,916 B2
(45) Date of Patent: Nov. 11, 2014

(54) FILM DEPOSITION APPARATUS, FILM DEPOSITION METHOD, AND COMPUTER READABLE STORAGE MEDIUM

(75) Inventors: Takeshi Kumagai, Iwate (JP); Hitoshi Kato, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 735 days.

(21) Appl. No.: 13/070,844

(22) Filed: Mar. 24, 2011

(65) Prior Publication Data

US 2011/0236598 A1   Sep. 29, 2011

(30) Foreign Application Priority Data

Mar. 29, 2010   (JP) .................................. 2010-075900

(51) Int. Cl.
C23C 16/00 (2006.01)
C23C 16/455 (2006.01)

(52) U.S. Cl.
CPC ..... *C23C 16/45551* (2013.01); *C23C 16/45536* (2013.01)
USPC .......................................................... 118/719

(58) Field of Classification Search
USPC .................. 118/719; 156/345.31–345.32
See application file for complete search history.

(56) References Cited

U.S. PATENT DOCUMENTS

| | | | |
|---|---|---|---|
| 6,428,859 B1 * | 8/2002 | Chiang et al. ............ | 427/255.26 |
| 6,634,314 B2 | 10/2003 | Hwang et al. | |
| 7,153,542 B2 | 12/2006 | Nguyen et al. | |
| 7,494,908 B2 * | 2/2009 | Chung et al. .................. | 438/597 |
| 2004/0058293 A1 * | 3/2004 | Nguyen et al. ................ | 432/129 |
| 2004/0187784 A1 * | 9/2004 | Sferlazzo ...................... | 118/719 |
| 2008/0026162 A1 * | 1/2008 | Dickey et al. .................. | 427/569 |
| 2008/0193643 A1 * | 8/2008 | Dip ............................. | 427/255.5 |
| 2009/0302024 A1 | 12/2009 | Aiba | |
| 2010/0055347 A1 | 3/2010 | Kato et al. | |
| 2011/0039026 A1 * | 2/2011 | Kato et al. .............. | 427/255.26 |
| 2011/0048326 A1 * | 3/2011 | Kato et al. ................ | 118/723 R |
| 2011/0104395 A1 * | 5/2011 | Kumagai et al. ............. | 427/554 |
| 2011/0155057 A1 * | 6/2011 | Kato et al. .................... | 118/719 |
| 2012/0222615 A1 * | 9/2012 | Kato et al. .................... | 118/719 |
| 2012/0267341 A1 * | 10/2012 | Kato et al. ...................... | 216/37 |
| 2013/0042813 A1 * | 2/2013 | Kato et al. .................... | 118/730 |
| 2013/0045587 A1 * | 2/2013 | Kraus et al. ................... | 438/478 |
| 2013/0047924 A1 * | 2/2013 | Enomoto et al. ............. | 118/725 |
| 2013/0061804 A1 * | 3/2013 | Enomoto et al. ............. | 118/712 |
| 2013/0118404 A1 * | 5/2013 | Kraus et al. .................. | 118/712 |
| 2013/0118407 A1 * | 5/2013 | Park et al. ..................... | 118/725 |
| 2013/0122718 A1 * | 5/2013 | Kato et al. .................... | 438/758 |

(Continued)

FOREIGN PATENT DOCUMENTS

| | | |
|---|---|---|
| JP | 3144664 | 1/2001 |
| KR | 10-2008-0028977 | 4/2008 |
| KR | 10-2010-0027062 | 3/2010 |

*Primary Examiner* — Gordon R Baldwin
*Assistant Examiner* — Charlee Bennett
(74) *Attorney, Agent, or Firm* — Ipusa, PLLC

(57) ABSTRACT

In an disclosed film deposition method, after a film deposition-alteration step is carried out that includes a film deposition process where a Si containing gas is adsorbed on a wafer W and the adsorbed Si containing gas on the wafer is oxidized by supplying an $O_3$ gas to the upper surface of the wafer, thereby producing a silicon oxide layer(s) by rotating a turntable on which the wafer is placed, and an alteration process where the silicon oxide layers) is altered by plasma, an alteration step where the silicon oxide layer(s) is altered by plasma while the Si containing gas is not supplied.

3 Claims, 12 Drawing Sheets

(56) References Cited

U.S. PATENT DOCUMENTS

| | | | |
|---|---|---|---|
| 2013/0164936 A1* | 6/2013 | Oshimo et al. | 438/680 |
| 2013/0180452 A1* | 7/2013 | Kato et al. | 118/719 |
| 2013/0189849 A1* | 7/2013 | Kato et al. | 438/758 |
| 2013/0196078 A1* | 8/2013 | Yudovsky et al. | 427/535 |
| 2013/0206067 A1* | 8/2013 | Kato et al. | 118/719 |
| 2013/0243971 A1* | 9/2013 | Thompson et al. | 427/554 |
| 2013/0251904 A1* | 9/2013 | Kato et al. | 427/255.7 |
| 2013/0337658 A1* | 12/2013 | Ikegawa et al. | 438/782 |

* cited by examiner

FIG.9

| NUMBER OF TIMES | 1 | | 2 | | ... |
|---|---|---|---|---|---|
| | PROCESS CYCLE | | PROCESS CYCLE | | |
| | FIRST STEP | SECOND STEP | FIRST STEP | SECOND STEP | ... |
| PROCESS | SUPPLYING Si CONTAINING GAS → SUPPLYING O₃ GAS → SUPPLYING OXYGEN PLASMA | SUPPLYING O₃ GAS → SUPPLYING OXYGEN PLASMA | SUPPLYING Si CONTAINING GAS → SUPPLYING O₃ GAS → SUPPLYING OXYGEN PLASMA | SUPPLYING O₃ GAS → SUPPLYING OXYGEN PLASMA | ... |
| PROCESS TIME | T1 | T2 | T1 | T2 | ... |

FILM DEPOSITION APPARATUS, FILM DEPOSITION METHOD, AND COMPUTER READABLE STORAGE MEDIUM

CROSS-REFERENCE TO RELATED APPLICATION

This application claims the benefit of priority of Japanese Patent Application No. 2010-075900, filed on Mar. 29, 2010, with the Japanese Patent Office, the entire contents of which are hereby incorporated by reference.

BACKGROUND OF THE INVENTION

1. Field of the Invention

The present invention relates to a film deposition apparatus and a film deposition method for depositing a film on a substrate in a vacuum chamber, and a computer readable storage medium storing a computer program for causing the film deposition apparatus to carry out the film deposition method.

2. Description of the Related Art

As a film deposition method for depositing a thin film on a surface of a substrate such as a semiconductor wafer, there has been known a so-called Atomic Layer Deposition (ALD) or Molecular Layer Deposition (MLD), where a first reaction gas and a second reaction gas are alternately supplied to the substrate, thereby depositing an atomic layer or a molecular layer of a reaction product. In such a film deposition method, when a film deposition temperature is low, for example, organic substances in the reaction gases may be incorporated into the film as impurities. In order to remove such impurities, an alteration process such as an annealing process and a plasma process may be carried out.

However, because the plasma process can only alter properties of an extremely shallow portion of the thin film, the film cannot be uniformly altered in a film thickness direction when the plasma process is carried out after the film deposition process is completed. In addition, when a plasma processing apparatus, which is provided separately from the film deposition apparatus, is used in order to carry out the plasma process, the substrate needs to be transferred from the film deposition apparatus to the plasma processing apparatus. Therefore, it takes a relatively long time to carry out the film deposition and the plasma alteration.

Incidentally, there have been proposed so-called semi-batch type film deposition apparatuses where a film deposition process is carried out by rotating a susceptor, on which plural substrates are placed, with respect to plural reaction gas supplying nozzles as disclosed in, for example, Patent Documents 1 to 3 listed below. However, Patent Documents 1 to 3 fail to provide concrete measures for solving the above problem.

Patent Document 1: U.S. Pat. No. 7,153,542 (FIGS. 8A, 8B).
Patent Document 2: Japanese Patent Publication No. 3144664 (FIGS. 1 and 2, and claim 1).
Patent Document 3: U.S. Pat. No. 6,634,314.

SUMMARY OF THE INVENTION

The present invention has been made in view of the above circumstances, and is directed to a film deposition apparatus, a film deposition method, and a computer readable storage medium storing a computer program that causes the film deposition apparatus to carry out the film deposition method, which realizes a thin film having uniform properties in a film thickness direction when film deposition is carried out by rotating a turntable, on which plural substrates are placed, with respect to reaction gas supplying portions to produce plural layers of the reaction products of the reaction gases on the substrate.

According to a first aspect of the present invention, there is provided a film deposition apparatus comprising: a table that has a substrate receiving area on which a substrate is place and is provided in a vacuum chamber; a first reaction gas supplying portion that supplies a first reaction gas to be adsorbed on an upper surface of the substrate to the substrate receiving area; a second reaction gas supplying portion that supplies a second reaction gas that reacts with the first reaction gas adsorbed on the upper surface of the substrate thereby to form a reaction product to the substrate receiving area; a plasma generation portion that activates an alteration gas into plasma so that an alteration process is carried out with respect to the reaction product on the substrate with the activated alteration gas; a rotation mechanism that rotates the table relative to the first reaction gas supplying portion, the second reaction gas supplying portion, and the plasma generation portion; and a control portion that outputs a control signal so that the film deposition apparatus is caused to perform at least once, a film deposition-alteration step where the first reaction gas and the second reaction gas are supplied to the substrate that is then exposed to the alteration gas activated by the plasma, and an alteration step where the alteration gas activated by the plasma is supplied to the substrate, while the first reaction gas is not supplied.

According to a second aspect of the present invention, there is provided a film deposition method comprising steps of: placing a substrate on a substrate receiving portion of a table provided in a vacuum chamber; and performing at least once a film deposition-alteration step and an alteration step in this order, wherein in the film deposition-alteration step, in order to perform a first reaction gas adsorption step that allows a first reaction gas to be adsorbed on an upper surface of the substrate, a reaction product production step that allows a second reaction gas and the first reaction gas adsorbed on the upper surface of the substrate to react each other, thereby producing a reaction product, and an alteration step that allows an alteration process to be performed with respect to the reaction product with plasma into which an alteration gas is activated, the table is rotated by a rotation mechanism relative to a first reaction gas supplying portion, a second reaction gas supplying portion, and a plasma generation portion, while the first reaction gas is supplied from the first reaction gas supplying portion, the second reaction gas is supplied from the second reaction gas supplying portion, and the alteration gas is supplied from the plasma, and wherein in the alteration step, the alteration gas activated by the plasma is supplied to the substrate in the substrate receiving area while the table is rotated, and the first reaction gas is not supplied.

According to a third aspect of the present invention, there is provided a computer readable storage medium that stores a computer program to be used in a film deposition apparatus wherein a substrate is placed in a substrate receiving area of a table provided in a vacuum chamber and a cycle of alternately supplying at least two kinds of reaction gases to the substrate is repeated plural times, the computer program comprising instruction steps that cause the film deposition apparatus to perform the film deposition method of the second aspect.

BRIEF DESCRIPTION OF THE DRAWINGS

FIG. 9 is a representation of an example of a gas supplying sequence of a film deposition method according to an embodiment of the present invention.

DETAILED DESCRIPTION OF THE PREFERRED EMBODIMENT

In embodiments of the present invention, the film deposition-alteration step and the alteration step are carried out in this order. In the film deposition-alteration step, a film deposition process of allowing the second reaction gas to react the first reaction gas adsorbed on the substrate to form the reaction product, and then an alteration process of altering the reaction product with the plasma are performed by rotating the table on which the substrates) is placed relative to the first reaction gas supplying portion, the second reaction gas supplying portion, and the plasma generation portion. In the alteration step, the other alteration process is performed by rotating the plasma generation portion relative to the table without supplying the first reaction gas. With this, a film having excellent uniformity and properties throughout in the thickness direction can be obtained.

Figure 1:
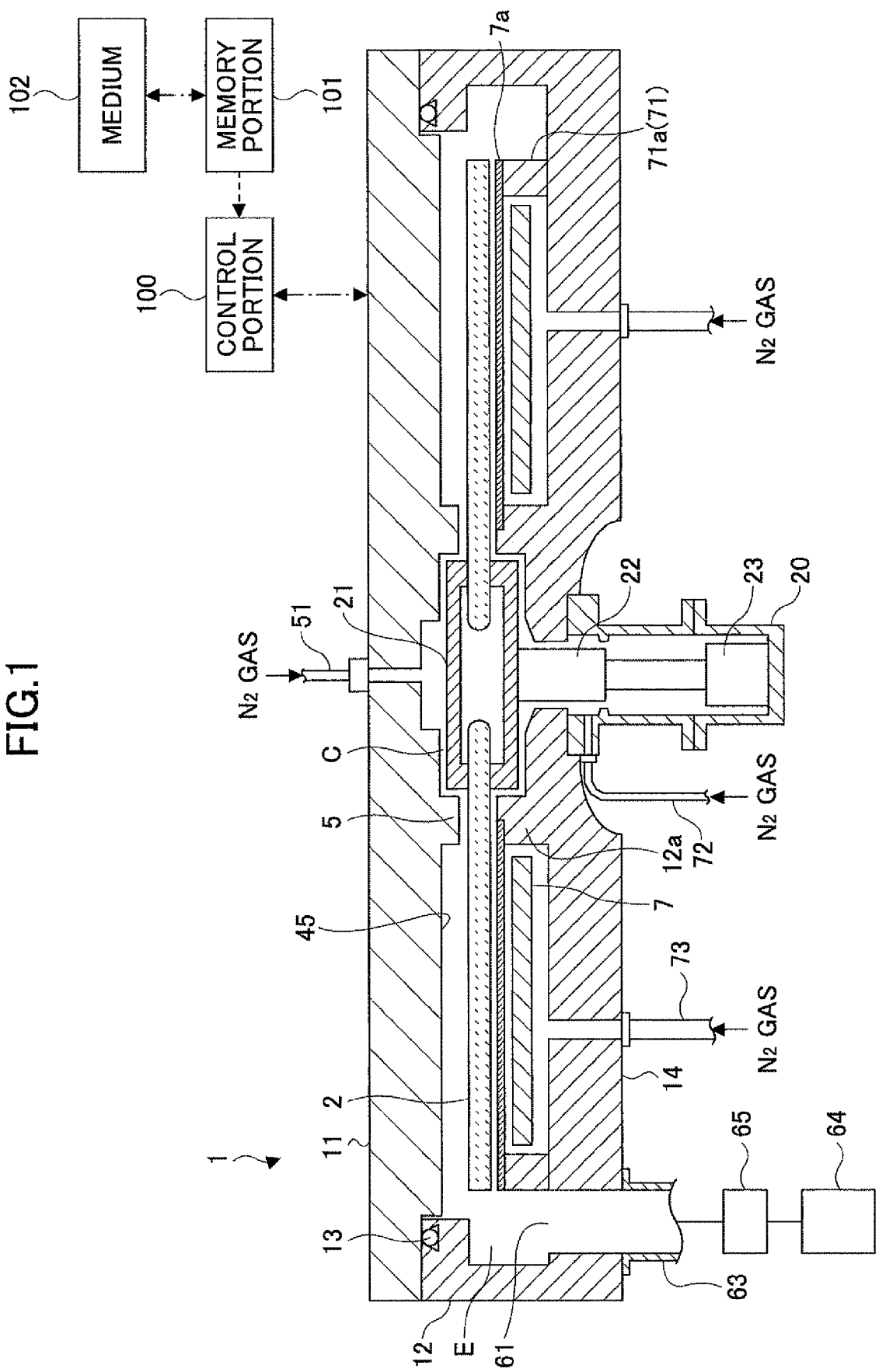
FIG. 1 is a vertical cross-sectional view of a film deposition apparatus according to an embodiment of the present invention, taken along I-I' line in FIG. 3.
Figure 3:
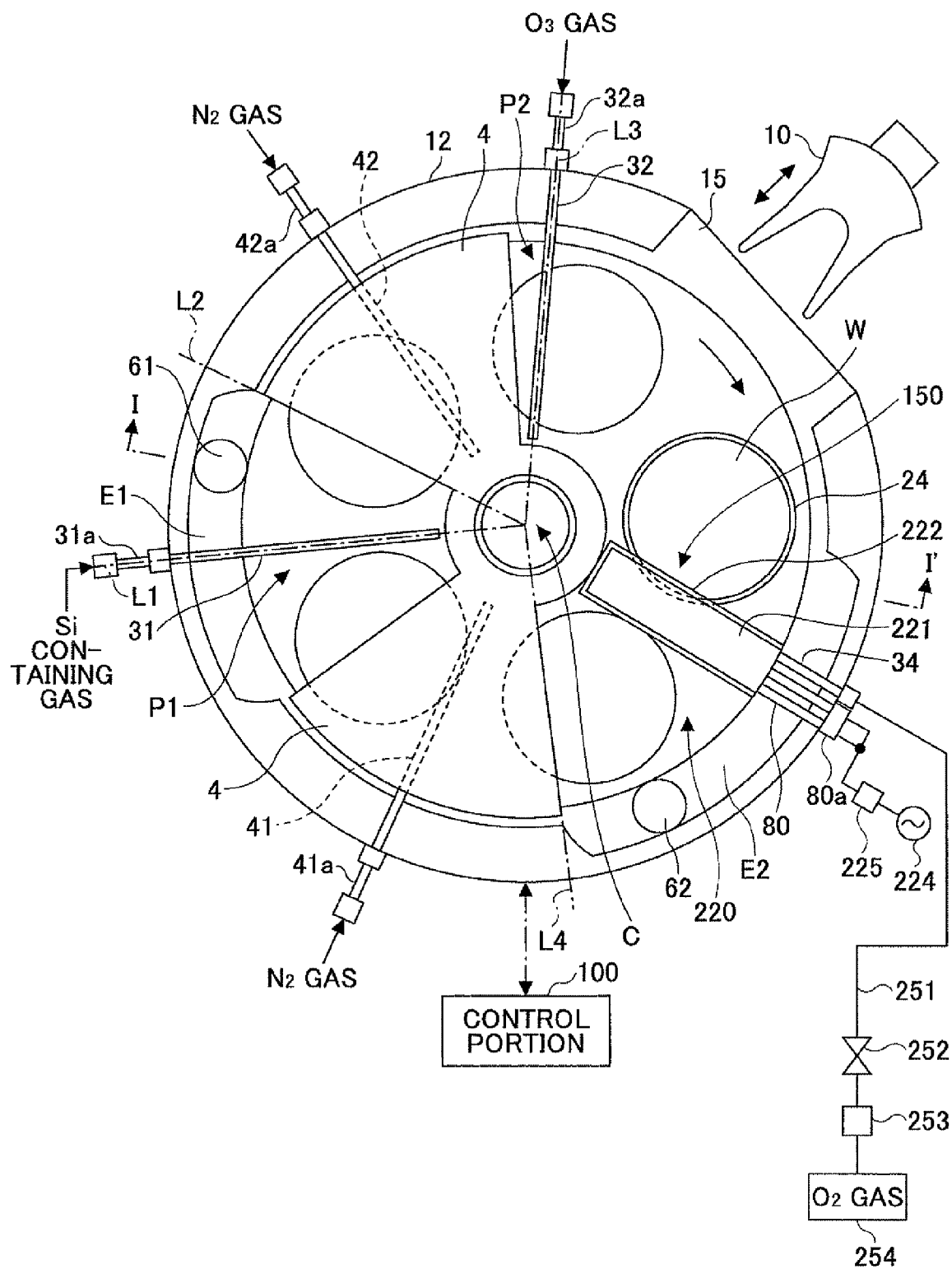
FIG. 3 is a plan view schematically illustrating the film deposition apparatus of FIG. 1.

Referring to FIG. 1, which is a cut-away diagram taken along I-I' line in FIG. 3, a film deposition apparatus according to an embodiment of the present invention is provided with a vacuum chamber 1 having a flattened cylinder shape, and a turntable 2 that is located inside the chamber 1 and has a rotation center at a center of the vacuum chamber 1. The vacuum chamber 1 is made so that a ceiling plate 11 can be separated from a chamber body 12. The ceiling plate 11 is pressed onto the chamber body 12 via a ceiling member such as an O ring 13, so that the vacuum chamber 1 is hermetically sealed. On the other hand, the ceiling plate 11 can be raised by a driving mechanism (not shown) when the ceiling plate 11 has to be removed from the chamber body 12.

The turntable 2 is rotatably fixed onto a cylindrically shaped core portion 21. The core portion 21 is fixed on a top end of a rotational shaft 22 that extends in a vertical direction. The rotational shaft 22 penetrates a bottom portion 14 of the chamber body 12 and is fixed at the lower end to a driving mechanism 23 that can rotate the rotational shaft 22 clockwise, in this embodiment. The rotational shaft 22 and the driving mechanism 23 are housed in a case body 20 having a cylinder with a bottom. The case body 20 is hermetically fixed to a bottom surface of the bottom portion 14 via a flanged pipe portion 20a, which isolates an inner environment of the case body 20 from an outer environment.

Figure 2:
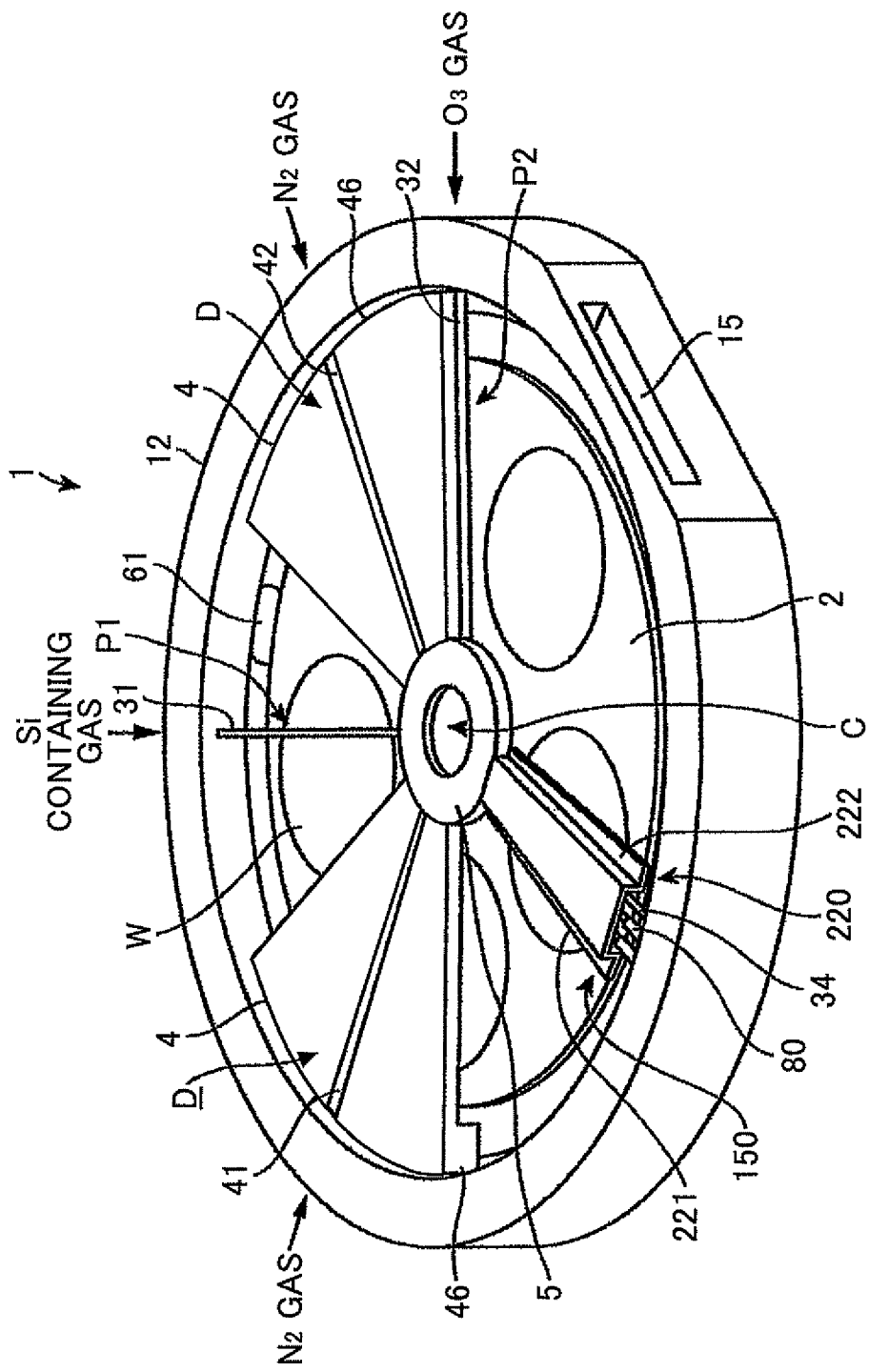
FIG. 2 is a perspective view schematically illustrating an inner configuration of the film deposition apparatus of FIG. 1.

As shown in FIGS. 2 and 3, plural (for example, five) circular concave portions 24, each of which receives a semiconductor wafer (referred to as a wafer, hereinafter) W, are formed in a top surface of and along a rotation direction (or a circumferential direction) of the turntable 2. Note that only one wafer W is illustrated in FIG. 3, for the sake of illustration. Each of the concave portions 24 has a diameter slightly larger, for example, by 4 mm than the diameter of the wafer W and a depth equal to a thickness of the wafer W. Therefore, when the wafer W is placed in the concave portion 24, a surface of the wafer W is at the same elevation of a surface of an area of the turntable 2, the area excluding the concave portions 24. In the bottom of the concave portion 24 there are formed three through holes (not shown) through which three corresponding elevation pins (not shown) are raised/lowered. The elevation pins support a back surface of the wafer W and raises/lowers the wafer W. The concave portions 24 are wafer W receiving areas provided to position the wafers W and prevent the wafers W from being thrown outwardly by centrifugal force caused by rotation of the turntable 2.

As shown in FIGS. 2 and 3, a first reaction gas nozzle 31, a second reaction gas nozzle 32, and separation gas nozzles 41, 42, and a activated gas injector 220, all of which may be formed of, for example, quartz, are arranged in radial directions and at predetermined angular intervals in the circumferential direction (or the rotation direction of the turntable 2). The nozzles 31, 32, 41, 42 oppose an area through which the concave portions 24 of the turntable 2 pass. In the illustrated example, the activated gas injector 220, the separation gas nozzle 41, the first reaction gas nozzle 31, the separation gas nozzle 42, and the second reaction gas nozzle 31 are arranged in this order in a clockwise direction (or the rotation direction of the turntable 2) from a transfer opening 15 (described later). The activated gas injector 220 and the nozzles 31, 32, 41, 42 are introduced into the vacuum chamber 1 from an outer circumferential wall of the chamber body 12, in order to extend along a radius direction of the chamber body 12 and to be parallel with the turntable 2. Gas introduction ports 31a, 32a, 41a, 42a serving as base ends of the corresponding nozzles 31, 32, 41, 42 go through the outer circumferential wall of the chamber body 12. The first reaction gas nozzle 31 and the second reaction gas nozzle 32 serve as a first reaction gas supplying portion and a second reaction gas supplying portion, respectively; and the separation gas nozzles 41, 42 serve as a separation gas supplying portion. The activated gas injector 220 is described later.

The reaction gas nozzle 31 is connected to a gas supplying source (not shown) of a first reaction gas containing silicon (Si) such as a bis (tertiary-butylamino) silane (BTBAS) gas, via a flow rate control valve (not shown). The reaction gas nozzle 32 is connected to a gas supplying source (not shown) of a second reaction gas such as ozone ($O_3$) gas or oxygen ($O_2$) gas, or the combination thereof, via a flow rate control valve (not shown). The separation gas nozzles 41, 42 are connected to a gas supplying source (not shown) of nitrogen ($N_2$) gas serving as a separation gas, via a flow rate control valve (not shown). Incidentally, the $O_3$ gas is used as the second reaction gas in the following explanation.

The reaction gas nozzles 31, 32 have plural ejection holes 33 open downward to eject the corresponding source gases to the turntable 2. The plural ejection holes 33 are arranged in longitudinal directions of the reaction gas nozzles 31, 32 at predetermined intervals of, for example 10 mm. An area below the reaction gas nozzle 31 is a first process area P1 in which the Si containing gas is adsorbed on the wafer W. An area below the reaction gas nozzle 32 is a second process area P2 in which the Si containing gas adsorbed on the wafer W is oxidized. The reaction gas nozzles 31, 32 are arranged away from a ceiling surface 45 and near the turntable 2 in the first and the second process areas P1, P2, respectively.

The separation nozzles 41, 42 are provided to form a separation area D that separates the first process area 21 and the second process area P2. In the separation area D, a convex portion 4 is provided on the lower surface of the ceiling plate 11 of the vacuum chamber 1. The convex portion 4 has a top view shape of a sector whose apex is severed along an arc line, and protrudes downward from the ceiling plate 11. An inner arc of the convex portion 4 is coupled with a protrusion portion 5 (described later) and an outer arc of the convex portion 4 lies near and along the inner circumferential surface of the chamber body 12 of the vacuum chamber 1. With the convex portion 4, the vacuum chamber 1 is divided into plural areas in the circumferential direction. In addition, the separation gas nozzle 41 (42) is housed in a groove portion 43 that is provided in such a manner that the groove portion 43 extends in the radial direction and substantially bisects the convex portion 4.

With the above configuration, there are flat low ceiling surfaces 44 (first ceiling surfaces) on both sides of the separation gas nozzle 41 (or 42), and high ceiling surfaces 45 (second ceiling surfaces) outside of the corresponding low ceiling surfaces 44. The convex portion 4 (ceiling surface 44) provides a separation space, which is a thin space, between the convex portion 4 and the turntable 2 in order to impede the first and the second gases from entering the thin space and from being mixed.

Namely, taking for an example the separation area D where the separation gas nozzle 41 is provided, this separation area D impedes the second reaction gas, which flows in the rotation direction of the turntable 2, from entering the thin space, and the first reaction gas, which flows in a direction opposite to the rotation direction of the turntable 2, from entering the thin space. Incidentally, a noble gas such as argon (Ar) gas may be used as the separation gas, without being limited to the nitrogen gas.

Figure 4:
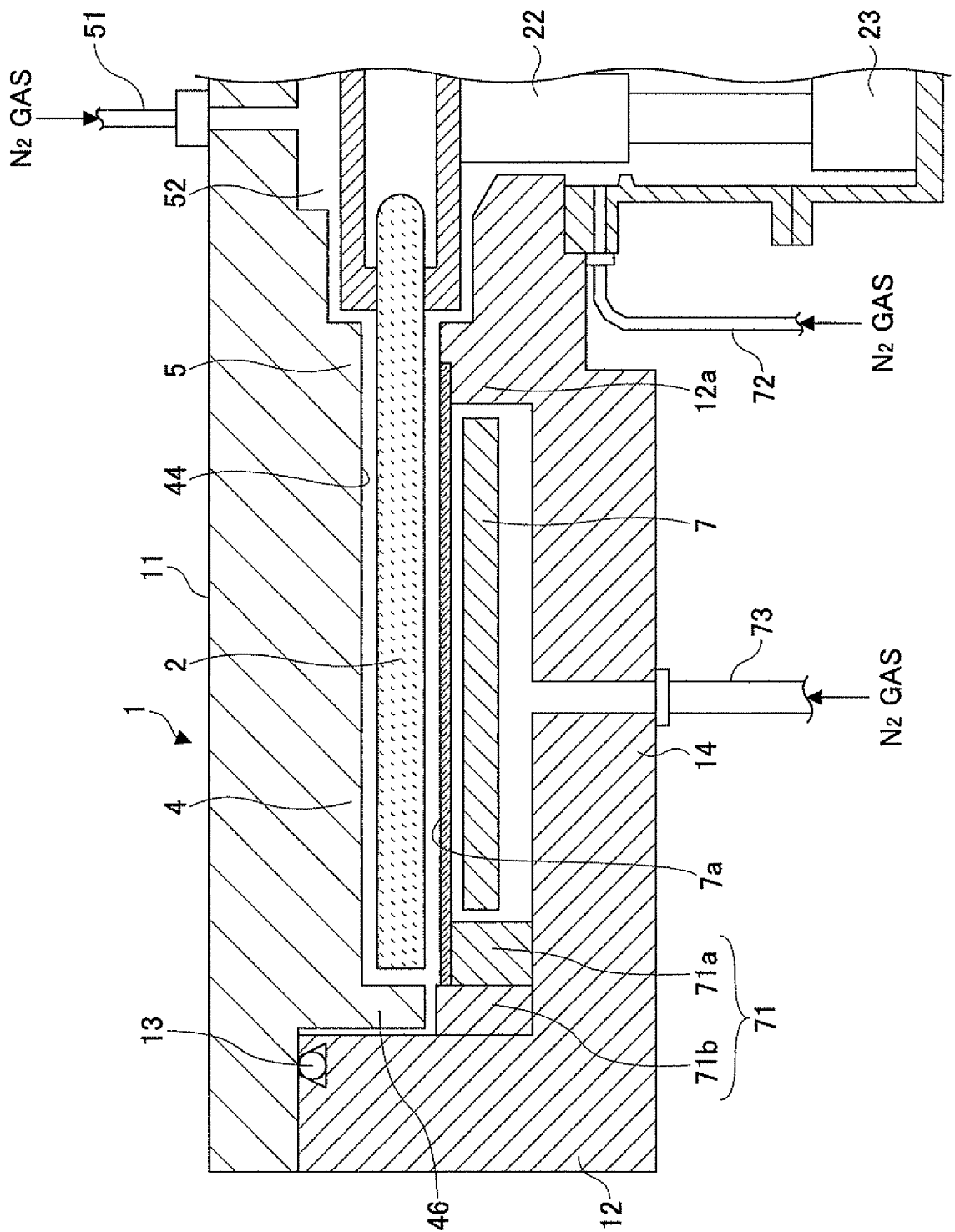
FIG. 4 is a vertical cross-sectional view schematically illustrating a part of the film deposition apparatus of FIG. 1.

In addition, the protrusion portion 5 is provided on the lower surface of the ceiling plate 11, as shown in FIG. 4. The protrusion portion 5 is provided along the outer circumferential surface of the core portion 21 in order to oppose the turntable 2 outside of the core portion 21. The protrusion portion 5 is formed to be continuous with the inner arc of the convex portion 4, in this embodiment, so that the lower surface of the protrusion portion 4 is at the same level as that of the convex portion 4 (or the ceiling surface 44).

Incidentally, FIGS. 2 and 3 are a perspective view and a top view that illustrate the inside of the chamber body 12, where the chamber body 12 is horizontally severed at the level that is lower than the ceiling surface 45 and higher than the separation gas nozzles 41, 42, for the sake of convenience.

As stated above, there are the ceiling surfaces 44 and the ceiling surfaces 45 that is higher than the ceiling surface 44 that are alternately arranged in the circumferential direction of the chamber body 12. FIG. 1 is a vertical cross-sectional view of an area where the ceiling surfaces 45 are provided; and FIG. 4 is a vertical cross-sectional view of an area where the ceiling surfaces 44 are provided. In a circumferential portion of the sector-shaped convex portion 4 (or an outer circumferential portion facing the inner surface of the chamber body 12), there is provided a bent portion 46 that bends in an L-shape. The bent portion 46 opposes the outer circumferential surface of the turntable 2 as shown in FIGS. 2 and 4. The bent portion 46 impedes the reaction gases from entering the separation area D from the both sides of the separation area D and from being mixed. Because the convex portion 4 is attached on the lower surface of the ceiling plate 11, and thus the convex portion 4 can be removed from the chamber body 12, there needs to be gaps between the outer circumferential surface of the turntable 2 and the inner circumferential surface of the bent portion 46 and between the outer circumferential surface of the bent portion 46 and the inner circumferential surface of the chamber body 12. These gaps may be as narrow as the height of the ceiling surface 44 with respect to the turntable 2, for example.

A circumferential wall of the chamber body 12 has a vertical inner wall that is close to the outer circumferential surface of the bent portion 46 in the separation area D, as shown in FIG. 4. On the other hand, the circumferential wall is indented outward in areas that do not correspond to the separation areas D, as shown in FIG. 1, so that there is a relatively large space with respect to the outer circumferential surface of the turntable 2 and from the bottom of the chamber body 12 up to the outer circumferential surface of the turntable 2. For the sake of the following explanation, the space having substantially a box shape is referred to as an evacuation area. Specifically, the evacuation area in gaseous communication with the first process area P1 is referred to as a first evacuation area E1, and the evacuation area in gaseous communication with the second process area P2 is referred to a second evacuation area E2, hereinafter. At the bottoms of the first and the second evacuation areas E1, E2, a first evacuation port 61 and a second evacuation port 62 are formed, respectively, as shown in FIGS. 1 and 3. The first and the second evacuation ports 61, 62 are connected to a vacuum pump 64 serving as an evacuation unit via an evacuation pipe 63, as shown in FIG. 1. A reference symbol 65 in FIG. 1 represents a pressure controller.

As shown in FIGS. 1 and 4, a heater unit 7 serving as a heating portion is provided in a space between the bottom portion 14 of the chamber body 12 and the turntable 2, so that the wafers W placed on the turntable 2 can be heated through the turntable 2 at a determined temperature, for example 450° C., which is determined by a process recipe. In addition, a ring-shaped cover member 71 is provided beneath the turntable 2 and near the outer circumference of the turntable 2 in order to surround the heater unit 7, so that the space where the heater unit 7 is placed is partitioned from the outside area of the block member 71, thereby impeding the gas from entering the space below the turntable 2. The cover member 71 includes an inner member 71a provided to face the outer circumferential portion of the turntable 2 and an area outside of the turntable 2 from below, and an outer member 71b provided between the inner member 71a and the inner circumferential surface of the chamber body 12. The outer member 71b is severed in part in order to leave spaces above the evacuation ports 61, 62, thereby allowing a space above the turntable 2 to be in gaseous communication with the evacuation ports 61, 62. In addition, the upper surface of the outer member 71b comes close to the bent portion 46. In other words, the cover member 71 includes the outer member 71b provided to come close to the bent portion 46 in an area below the bent portion 46 formed at the outer circumferential portion of the convex portion 4, and the inner member 71a that is provided below the outer circumferential portion of the turntable 2 and surrounds the heater unit 7.

A protrusion portion 14 that comes close to the lower surface of the core portion 21 is provided inside the space where the heater unit 7 is housed (or in an area closer to the rotation center of the turntable 2 than the space where the heater unit 7 is housed) in the bottom portion 14, leaving a narrow space between the protrusion portion 14 and the core portion 21. In addition, there is another narrow space between a center hole through which the rotational shaft 22 passes and the rotational shaft 22, and this narrow space is in gaseous communication with the case body 20. A purge gas supplying pipe 72 is connected to an upper portion of the case body 20. Moreover, plural purge gas supplying pipes 73 are connected at predetermined angular intervals to areas below the heater unit 7 in order to purge the space where the heater unit 7 is housed. A cover member 7a, which may be formed of, for example, quartz glass, is supported by the upper surface of the inner member 71 and the upper portion of the protrusion portion 12a, so that the heater unit 7 is covered by the cover member 7a and thus gases are substantially prevented from entering the space where the heater unit 7 is housed.

Referring to FIGS. 1 and 4, a separation gas supplying pipe 51 is connected to the top center portion of the ceiling plate 11 of the chamber 1, so that $N_2$ gas is supplied as a separation gas to a space 52 between the ceiling plate 11 and the core portion 21. The separation gas supplied to the space 52 flows through the thin gap 50 between the protrusion portion 5 and the turntable 2 and then along the top surface of the turntable 2. Because the space surrounded by the protrusion portion 5 is filled with the $N_2$ gas, the reaction gases (BTBAS, $O_3$) cannot be mixed between the first process area 21 and the second process area 22 through the center portion of the turntable 2.

FIGS. 2 and 3 show a transport opening 15 through which the wafer W is transferred into or out from the vacuum chamber 1 by a transfer arm 10 (see FIG. 3). The transfer opening 15 is provided with a gate valve (not shown) by which the transfer opening 15 is opened or closed. Because the wafer W is transferred into the vacuum chamber 1 through the transfer opening 15 and placed in the concave portion 24 in the turntable 2, lift pins and an elevation mechanism (not shown) are provided in area corresponding to the transfer opening 16 below the turntable 2. The lift pins can move upward/downward through corresponding through-holes (not shown) formed in the turntable 24, so that the wafer W is transferred between the transfer arm 10 and the concave portion 24 of the turntable 2.

Figure 5:
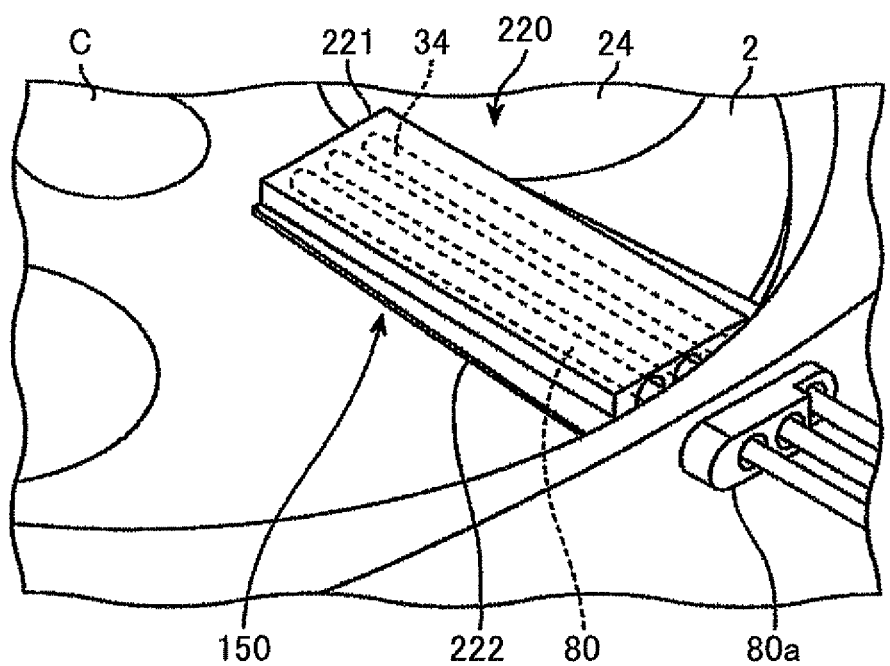
FIG. 5 is an enlarged perspective view illustrating an example of an activated gas injector.
Figure 6:
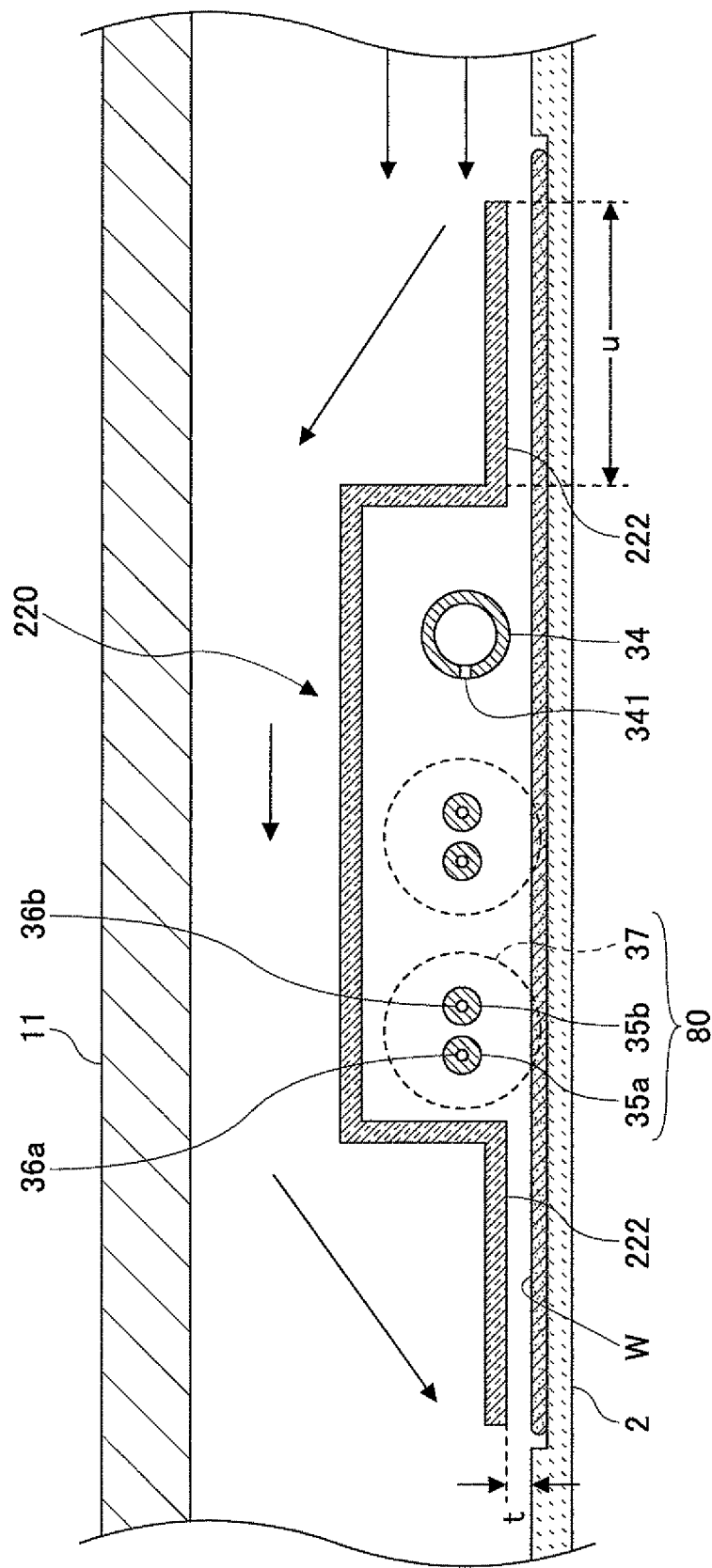
FIG. 6 is a vertical cross-sectional view of the activated gas injector of FIG. 5.

Next, the activated gas injector 220 is described. The activated gas injector 220 is arranged to generate plasma in an area above the turntable 2 and along the radius direction of the turntable 2, so that the entire surface of the wafer W placed in the concave portion 24 can be exposed to the plasma. The activated gas injector 220 is to alter properties of a silicon oxide film deposited on the wafer W through reaction of the Si containing-gas and the $O_3$ gas every rotation of the turntable 2. In order to introduce a property alteration gas to be activated by the plasma, the activated gas injector 220 is provided with a gas introduction nozzle 34 serving as a property alteration gas supplying portion, as shown in FIGS. 5 and 6. The gas activation nozzle 34 may be made of, for example, quartz glass. In addition, the activated gas injector 220 has a plasma generation member composed of a pair of sheath pipes 35a, 35b located downstream relative to the rotation direction of the turntable 2 in relation to the gas introduction nozzle 34. The plasma generation member 80 generates the plasma that activates the property alteration gas supplied from the gas introduction nozzle 34. The sheath pipes 35a, 35b have a rod shape and are parallel with each other. In the illustrated example, two plasma generation members 80 having the same length are provided to be parallel with each other. In other embodiments, three or more plasma generation members 80 may be provided.

The gas introduction nozzle 34 and the plasma generation members 80, 80 go through the circumferential wall of the chamber body 12 in an air-tight manner, and are arranged to be parallel with the turntable 2 (and thus the wafer W in the concave portion 24) along the tangential direction to the rotation direction of the turntable 2. In addition, the gas introduction nozzle 34 and the plasma generation members 80, 80 are supported by their base end portion 80a fixed in the circumferential wall of the chamber body 12. Reference symbols 341 in FIG. 6 represent plural gas holes provided along the longitudinal direction of the gas introduction nozzle 34.

As shown in FIG. 3, one end of a plasma gas line 251 that supplies the property alteration gas, for example, $O_2$ gas, to be activated into plasma is connected to the gas introduction nozzle 34, and the other end of the plasma gas line 251 is connected to a plasma gas supplying source 254 that stores the property alteration gas through a valve 252 and a flow rate controller 253. As the property alteration gas, a noble gas such as argon (Ar) gas and helium (He) gas may be used instead of or in addition to the $O_2$ gas.

The sheath pipes 35a, 35b in each of the plasma generation members 80, 80 may be made of, for example, quartz glass, alumina (aluminum oxide), or yttria (yttrium oxide, $Y_2O_3$). In addition, electrodes 36a, 36b, which may be made of, for example, nickel alloy or titanium, are inserted into the corresponding sheath pipes 35a, 35b, as shown in FIG. 6, thereby constituting parallel electrodes. High frequency electric power having a frequency of, for example, 13.56 MHz is applied at, for example, 500 W across the electrodes 36a, 36b from a high frequency supplying source 224 through a matching box 225. Reference symbols 37 in FIG. 6 represent protection pipes connected to a base end side of the sheath pipes 35a, 35b (or in the side of the inner circumferential surface of the chamber body 12). The protection pipes 37 are omitted in FIG. 5 or the like. In addition, the sheath pipes 35a, 35b are omitted in drawings except for FIG. 6.

Figure 7:
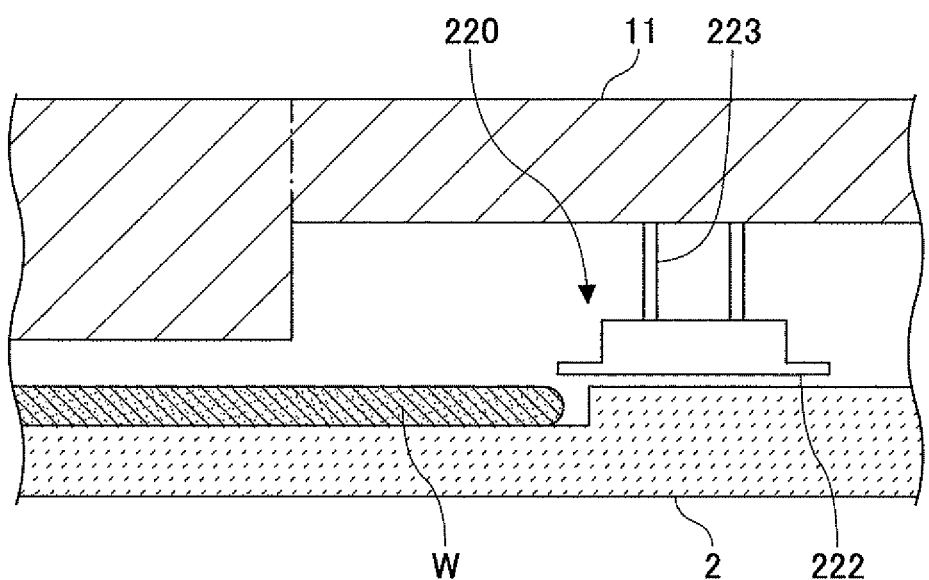
FIG. 7 is a vertical cross-sectional view illustrating a part of the film deposition apparatus, where the activated gas injector is provided.

A reference symbol 221 in FIG. 5 represents a cover body that is arranged to cover a top side and four side areas (both sides along the long and short edges) of a space where the gas introduction nozzle 34 and the sheath pipes 35a, 35b are provided. The cover body 221 may be made, for example, an insulating material or quartz glass. In addition, reference symbols 222 in FIG. 5 represent flow limiting surfaces that extend in a flange shape in a horizontal direction. Specifically, the flow limiting surfaces 222 are provided from one end through the other end of the cover body 221 along the longitudinal direction of the cover body 21 and extend outward from the corresponding lower edge portions of the cover body 221. According to the flow limiting surfaces 222, the gases such as the $O_3$ gas and the $N_2$ gas flowing along the rotation direction of the turntable 2 over the upper surface of the turntable 2 are impeded from entering the inside of the cover member 221. In addition, the flow limiting surfaces 222 are arranged close to the upper surface of the turntable 2 so that a gap t between the flow limiting surface 222 and the upper surface of the turntable 2 is small enough to efficiently impede the gases from entering the inside of the cover body 221. Moreover, the flow limiting surface 222 has a width u that becomes wider in the rotation direction of the turntable 2 along a direction toward the inner circumferential surface of the chamber body 12. Note that the gases in the vacuum chamber 1 flow faster in an outer area than an inner area of the vacuum chamber 1 because of the rotation of the turntable 2. Therefore, the flow limiting surface 222 that becomes wider toward the outer area of the vacuum chamber 1 is advantageous to impede the gases flowing in the outer area from entering the inside the cover body 222. Reference symbols 223 in FIG. 7 represent supporting members provided between the cover body 221 and the ceiling plate 11 of the vacuum chamber 1 in order to support the cover body 221 from the ceiling plate 11. The supporting members 223 are simplified in FIG. 7, for the sake of convenience.

In addition, the film deposition apparatus according to this embodiment is provided with a control portion 100, which is made of a computer, for controlling entire operations of the film deposition apparatus. The control portion 100 includes a memory portion 101 (see FIG. 1) that stores a computer program that causes the film deposition apparatus to carry out a film deposition method including a film deposition-alteration step (a first step) where the film deposition and the property alteration are carried out during one rotation of the turntable 2, and an alteration step (a second step) where only the property alteration is carried out during one rotation of the turntable 2. The first and the second steps are carried out in this order. In addition, the memory portion 101 stores a time ratio (T1/T2) of the first step and the second step, a total time (T1+T2) of the first step and the second step, and the number of cycles of the first step and the second step, where the T1 represents a step time of the first step and T2 represents a step time of the second step. The computer program includes a group of instructions that causes the film deposition apparatus to carry out the film deposition method. The computer program may be stored in a computer readable storing medium 102 (see FIG. 1) such as a hard disk, a compact disk, a magneto-optical disk, a memory card, and a flexible disk, and downloaded to the memory portion 102 and further to the control portion 100.

Next, the operations of the film deposition apparatus according to this embodiment (film deposition method) are described in the following. First, one of the concave portions 24 of the turntable is in alignment with the transfer opening 15 by appropriately rotating the turntable 2. Next, the gate valve (not shown) is opened, and the wafer W is transferred into the vacuum chamber 1 through the transfer opening 15 by the transfer arm 10 and is placed in the concave portion 24 of the turntable 2 by the lift pins (not shown) and the transfer arm 10 that cooperatively operate. Such operations are intermittently repeated so that five wafers W are placed in the corresponding concave portions 24 of the turntable 2.

Next, after the transfer arm 10 recedes from the vacuum chamber 1, the gate valve (not shown) is closed and the vacuum chamber 1 is evacuated to the reachable lowest pressure by the vacuum pump 64. Then, the $N_2$ gas is supplied at predetermined flow rates from the separation gas nozzles 41, 42, the separation gas supplying pipe 51, and the purge gas supplying pipes 72. Along with this, the inside space of the vacuum chamber 1 is maintained at a predetermined pressure by the pressure controller 65. Next, the turntable 2 starts rotating in a clockwise direction at a rotational speed of, for example, 20 revolutions per minute (rpm), and the wafer W is heated at, for example, 450° C. by the heater unit 7.

Subsequently, the Si containing gas is supplied from the reaction gas nozzle 31; the $O_3$ gas is supplied from the reaction gas nozzle 32; the $O_2$ gas is supplied at, for example, 5 standard liters per minute (slm) from the gas introduction nozzle 34; and the high frequency electric power having a frequency of 13.56 MHz is applied across the sheath pipes 35a, 35b (the electrodes 36a, 36b).

In this case, the $O_2$ gas ejected from the gas introduction nozzle 34 toward the sheath pipes 35a, 35b through the plural gas holes 341 is activated by the high frequency electric power applied across the sheath pipes 35a, 35b to generate plasma including, for example, oxygen ions, oxygen radicals, or the like in the activated gas injector 220. This plasma (activated species) moves downward from the activated gas injector 220 toward the wafer W that rotates along with the turntable 2.

Figure 8:
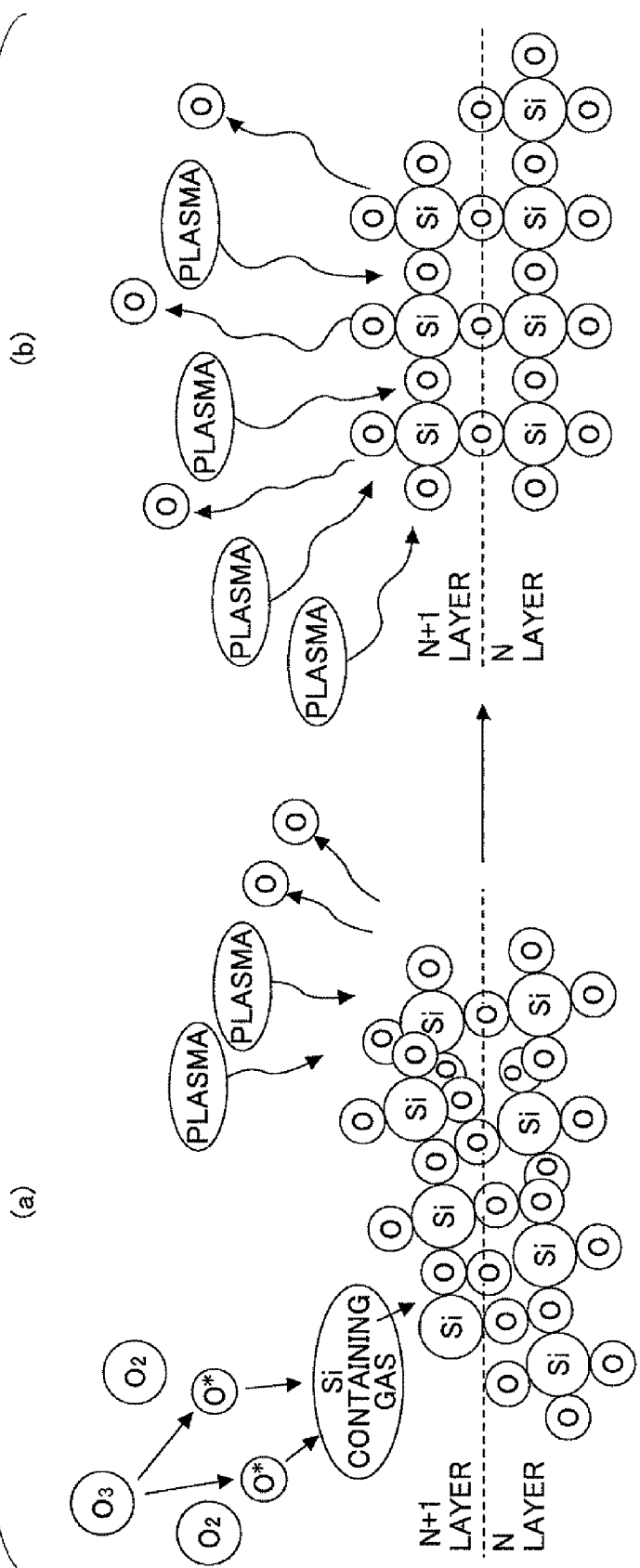
FIG. 8 is a schematic view illustrating how a silicon oxide film is chemically altered according to an embodiment of the present invention.

On the other hand, the Si containing gas is adsorbed on the upper surface of the wafer W in the first process area P1, and the Si containing gas adsorbed on the upper surface of the wafer W is oxidized by the $O_3$ gas in the second process area P2, thereby producing a molecular layer(s) of the silicon oxide. In this silicon oxide layer(s), impurities such as moisture (or OH group) and organic substances may be incorporated from groups of the Si containing gas. When the wafer W reaches an alteration area 150, which is below the activated gas injector 220, the silicon oxide layer(s) is altered by the plasma. Specifically, the impurities are removed from the silicon layer(s) or the silicon atoms and the silicon atoms are re-arranged when the upper surface of the wafer W (or the silicon layer(s) formed on the wafer W) is exposed by the plasma or bombarded by active species in the plasma, as schematically shown in FIG. 8(a). Therefore, the silicon layer (s) is purified and becomes densified. When the turntable 2 is rotated two turns, or the film deposition-alteration step including the film deposition process and the alteration process is carried out for six seconds, a silicon oxide layer having a film thickness of 0.25 nm is produced on the upper surface of the wafer W.

Incidentally, depending on flow rates of the reaction gases, a film thickness of the reaction product per one cycle of the film deposition process (per one rotation of the turntable 2), a rotational speed of the turntable 2, or the like, the above alteration of the reaction product may not be sufficiently carried out. Namely, the reaction product formed on the upper surface of the wafer W may still have impurities or may still be insufficiently densified in the film deposition-alteration step. Therefore, the alteration step is carried out in order to sufficiently alter the reaction product formed on the upper surface of the wafer W in the film deposition-alteration step.

Specifically, while the flow rates of the gases from the second reaction gas nozzle 32, the gas introduction nozzle 34, the separation gas nozzles 41, 42, and the supplying pipes 51, 72 are maintained the same as in the film deposition-alteration step by the control portion 100, supplying the Si containing gas from the first reaction gas nozzle 31 is terminated. In this case, because the flow rate of the Si containing gas at the film deposition-alteration step is smaller than those of the $O_3$ gas and the separation gas, a pressure in the vacuum chamber 1 is not significantly changed when the process steps change from the film deposition-alteration step to the alteration step (or when the supplying the Si containing gas is terminated).

When the Si containing gas is not supplied, the Si containing gas is rapidly evacuated from the vacuum chamber 1 in such a manner that the separation gases push the Si containing gas in the vacuum chamber 1 toward the evacuation port 61. In addition, the Si containing gas remaining in the reaction gas nozzle 31 is also evacuated from the evacuation port 61. In this case, it may be said that the first process area 1 is not created in the vacuum chamber 1 at the alteration step. Therefore, the wafer W passes through the second process area P2 and the alteration area 150 in this order because of rotation of the turntable 2.

In the second process area P2, the reaction product is not adversely affected when the reaction product on the upper surface of the wafer W has been already oxidized. On the other hand, the alteration process is carried out in the alteration area 150, so that the impurities are removed from the reaction product, and the silicon and oxide atoms are rearranged. When the turntable 2 is rotated six turns (for example, 18 seconds) in such a manner, the reaction product on the upper surface of the wafer W is exposed to the plasma. Therefore, the reaction product on the upper surface of the wafer W is altered to a greater degree in the alteration step than in the film deposition-alteration step. In addition, the reaction product on the upper surface of the wafer W is sufficiently thin after the film deposition-alteration step so that the reaction product is uniformly altered in the film thickness direction.

Figure 10:
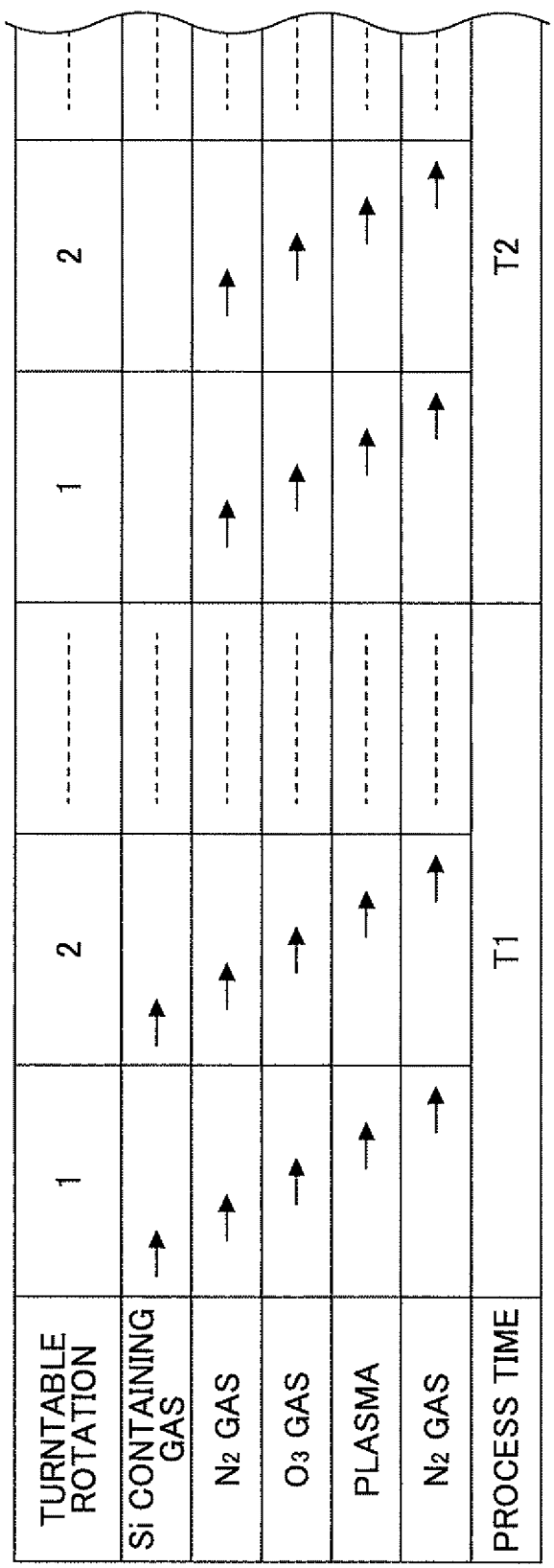
FIG. 10 is another representation of the gas supplying sequence the film deposition method according to an embodiment of the present invention.

Namely, because the rearrangement of the atoms takes place in a vertical (film thickness) direction (or between an Nth layer and an (N+1)th layer), the reaction product having uniform properties in the film thickness direction. In this case, assuming that step times of the film deposition-alteration step and the alteration step are T1 and T2, respectively, the process step time ratio (T1/T2) is 1/3 (6/18 seconds). In addition, the total step time (T1+T2) is 24 seconds (6+18 seconds). In this case, while the Si containing gas is intermittently supplied, the $O_3$ gas and the plasma ($O_2$ gas) are continuously supplied at the same flow rates throughout plural process cycles, as shown in FIG. 9. In other words, the wafer W is exposed to the Si containing gas, the $O_3$ gas, and the plasma plural times in this order in the film deposition-alteration step, and to the $O_3$ gas and the plasma plural times in this order (without the Si containing gas) in the alteration step, as shown in FIG. 10.

When the process cycles are repeated plural times (for example, 40 times), the reaction product layer (s), which has been altered, is formed, and thus the thin film having improved and uniform film properties is deposited on the wafer W. Because the five wafers W are placed along the circumferential direction on the turntable 2, when the film deposition-alteration step is initiated, the wafer W may be exposed to the $O_3$ gas or the plasma before the Si containing gas. In addition, when the process steps are switched from the film deposition-alteration step to the alteration step after only a part of the upper surface of the wafer W has been exposed to the Si containing gas, the remaining part of the wafer W is not exposed to the Si containing gas. In these cases, there may be thickness variations in the same wafer W or between the wafers W. However, because the process cycles are repeated plural times, such variations become less significant. Therefore, the thin films having improved and uniform film properties can be obtained.

Because the separation area D is not provided between the activated gas injector 220 and the second reaction gas injector 32 in the vacuum chamber 1, the $O_3$ gas and the separation gas ($N_2$ gas) flows toward the activated gas injector 220 from the upstream side of the activated gas injector 220 because of rotation of the turntable 2. However, such gases are least likely to flow through the space between the activated gas injector 220 and the turntable 2. This is because the cover body 221 is arranged closer to the upper surface of the turntable 2, leaving the narrow gap t between the flow limiting surface 222 and the turntable 2 and a wider area above the cover body 221. In addition, another reason is that a pressure is higher in the inside of the cover body 221 than in the outside of the cover body 221 because the alteration gas is supplied to the inside of the cover body 221 from the gas introduction nozzle 34.

In addition, because the flow limiting surface 222 has the width u that becomes greater toward the outer circumference of the turntable 2, the gases flowing toward the activated gas injector 220 from the upstream side of the activated gas injector 220 can rarely flow into the inside of the cover body 221 even when the gases flow faster in an area near the outer circumference of the turntable 2. Therefore, the gases flowing toward the activated gas injector 220 from the upstream side of the activated gas injector 220 flow above the activated gas injector 222 and into the evacuation port 62, as shown in FIG. 6. Accordingly, because the $O_3$ gas and the $N_2$ gas are not influenced by the high frequency electric power, $NO_x$, for example, is not generated and thus the inner surface of the vacuum chamber 1 or members in the vacuum chamber 1 are less likely to be corroded by the $NO_x$. In addition, the wafers W are rarely influenced by the $NO_x$. Incidentally, the impurities that are removed from the silicon oxide by the alteration process may become gas and thus evacuated along with the $O_3$ gas, $O_2$ gas, and $N_2$ gas through the evacuation port 62.

Figure 11:
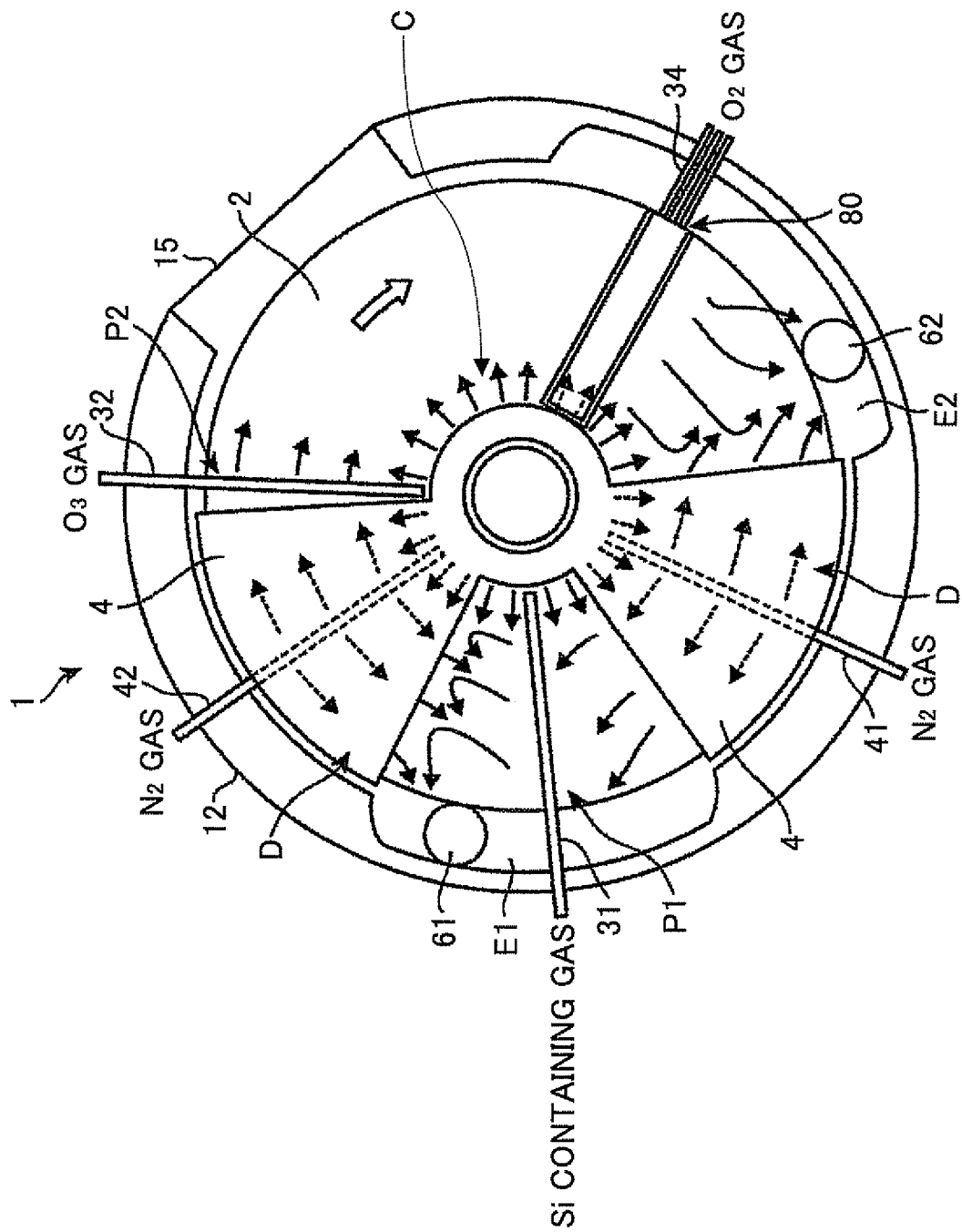
FIG. 11 is a schematic view illustrating a gas flow pattern of gases in the film deposition apparatus of FIG. 1.

In addition, because the $N_2$ gas serving as the separation gas is supplied in an area between the first process area P1 and the second process area P2 and the $N_2$ serving as the separation gas is supplied from the center area C, the Si containing gas and the $O_3$ gas are evacuated from the corresponding evacuation ports 61, 62 in the film deposition-alteration step, as shown in FIG. 11.

Moreover, because the inner circumferential surface of the circumferential wall of the chamber body 12 is indented outward in an area below the high ceiling surface 45 below which the reaction gas nozzles 31, 32 and the activated gas injector 220 are arranged, so that the evacuation areas E are created, and the evacuation ports 61, 62 are formed below the evacuation areas E, a pressure in the area below the high ceiling surface 45 is lower than a pressure in the thin area below the ceiling surface 44 and the center area C.

Incidentally, because the area below the turntable 2 is purged with the $N_2$ gas, the gases that have reached the evacuation area E are less likely to flow into the first process area P1 or the second process area P2 through the area below the turntable 2.

An example of process parameters preferable in the film deposition apparatus according to this embodiment is listed in the following. A rotational speed of the turntable 2 is 1 through 500 rpm (in the case of the wafer W having a diameter of 300 mm); a pressure in the vacuum chamber 1 is about 1.067 kPa (8 Torr); a flow rate of the Si containing gas is 100 sccm; a flow rate of the $O_3$ gas is about 10000 sccm; a flow rate of the $N_2$ gas from the separation gas nozzles 41, 42 is about 20000 sccm; and a flow rate of the $N_2$ gas from the separation gas supplying pipe 51 at the center of the vacuum chamber 1 is about 5000 sccm. In addition, the number of cycles of alternately supplying the reaction gases to the wafers W is, for example about 1000, though changes depending on the film thickness required.

In this embodiment, after the film deposition-alteration process that includes the film deposition process where the silicon oxide film is formed by adsorbing the Si containing gas on the upper surface of the wafer W, and supplying the $O_3$ gas thereby to oxidize the Si containing gas on the upper surface of the wafer W into the silicon oxide, and the property alteration process where the silicon oxide is altered by using the plasma, the property alteration process is carried out that alters the silicon oxide on the wafer W without supplying the Si containing gas. Therefore, the thin film having uniform and improved film properties in the film thickness direction can be obtained. In addition, the step time ratio (T1/T2) and the total step time (T1+T2) may be changed so that a degree of alteration can be adjusted in a wider range. For example, when the number of cycles of film deposition in the film deposition-alteration step is decreased (or the step time T1 of the film deposition-alteration step is shortened), the step time of the alteration step T2 is lengthened, or the total step time (T1+T2) is decreased thereby to decrease a thickness of the reaction production per cycle, the degree of alteration is increased. As described later, the thin film having film properties comparative to those of thermal silicon oxide can be obtained.

If only the film deposition-alteration step is carried out without the alteration step (namely, the film deposition process and the alteration process are carried out per rotation of the turntable 2), a layer(s) of the reaction product is formed and altered, and another layer (s) of the reaction product is formed and altered on the previous layer(s) of the reaction product, and these procedures are repeated. In this case, because only the extremely thin layer can be altered by the plasma, the alteration insufficiently takes place. Therefore, the layer(s) of the reaction product that is insufficiently altered is formed repeatedly. As a result, only the thin film having insufficiently improved film properties can be obtained. On the other hand, when the previous layer(s) of the reaction product is altered before a subsequent layer(s) of the reaction product is formed on the previous layer(s) of the reaction product, the alteration can sufficiently take place even when the wafer W passes through the alteration area 150 in a short period of time. Therefore, the thin film having improved and uniform film properties can be obtained according to this embodiment of the present invention.

When trying to sufficiently alter the reaction product that may be obtained in various process recipes, or to enlarge a process window that enables sufficient alteration, the high frequency electric power supplied to the plasma generation member 80 from the high frequency electric power source 224 may be increased, or the plasma generation member 80 is arranged closer to the turntable 2, or many of the plasma generation members 80 are provided in order to enlarge the alteration area 150.

However, the degree of the alteration is adjusted only by changing a sequence of the process cycles, without changing the configurations of the film deposition apparatus, according to an embodiment of the present invention. In other words, a greater process window may be realized without making the film deposition apparatus complex.

In addition, because the $O_3$ gas flow rates are not changed between the film deposition-alteration step and the alteration step, the pressure inside the vacuum chamber 1 is less likely to vary. Therefore, gas turbulence or damage (breakage) incurred on the members in the vacuum chamber 1 are avoided. Incidentally, when the pressure inside the vacuum chamber 1 is not significantly changed so that the gas turbulence does not take place, the $O_3$ gas is not necessary in the alteration step. Alternatively, when the supplying the $O_3$ gas is terminated, a flow rate of the separation gas may be increased by the flow rate of the $O_3$ gas, in order to keep the pressure inside the vacuum chamber 1 substantially unchanged.

In addition, because the film deposition-alteration step and the alteration step are switched from one to the other (in other words, supplying the Si containing gas starts and is terminated) after the turntable 2 rotates n times (n: integer), as shown in FIG. 10, it is relatively easy to control the film thickness of the reaction product and to control the timing of the switching. Incidentally, the film deposition-alteration step and the alteration step may be switched from one to the other after the turntable 1 rotates less than one rotation, which may make variations of the film properties and film thickness uniformity because the wafers W on the turntable 2 are exposed to different gases or plasma at different timings in this case. However, because the process cycle is repeated plural times, the film properties and film thickness uniformity across the wafer W and between the wafers W are made uniform. Preferably, the switching timing may be controlled so that each of the wafers W is exposed to all the gases and the plasma the same number of times. For example, it is preferable that each of the wafers W on the turntable 2 can be exposed to the Si containing gas the same number of times.

Moreover, in the film deposition-alteration step, the alteration process is carried out with respect to the wafer W when the wafer W moves along the way from the second process area P2 to the first process area P1 in the vacuum chamber 1 every time after the film deposition process, in such a manner that the film deposition is not influenced by the alteration process. In addition, because the alteration process is carried out every time after the film deposition process in the film deposition-alteration step, the thin film can be altered in a shorter time compared to a case where the thin film is altered after the film deposition is completed.

In addition, because the cover body 221 can impede the gas flowing toward the activated gas injector 220 from the upstream side from entering the inside of the cover body 221, an additional separation area D does not need to be provided between the reaction gas nozzle 32 and the activated gas injector 220. Therefore, production costs of the film deposition apparatus can be reduced. In addition, a by-product such as $NO_x$ is less likely to be produced, so that the members that constitute the vacuum chamber 1 are less likely to be corroded. Moreover, because the cover body 12 is made of an insulating material, the cover body 221 is arranged closer to the plasma generation member 80, so that the film deposition apparatus may be compact.

The reaction gases that may be used in the film deposition of silicon oxide according to an embodiment of the present invention are a bis (tertiary-butylamino) silane (BTBAS) gas, dichlorosilane (DCS), hexachlorodisilane (HCD), tris(dimethyl amino) silane (3DMAS), monoamino-silane, or the like. In addition, Trimethyl Aluminum (TMA), tetrakis-ethyl-methyl-amino-zirconium (TEMAZ) tetrakis-ethyl-methyl-amino-hafnium (TEMAH), bis(tetra methyl heptandionate) strontium ($Sr(THD)_2$) (methyl-pentadionate) (bis-tetra-methyl-heptandionate) titanium (Ti(MPD)(THD)), monoamino-silane, or the like may be used as the first reaction gas, so that an aluminum oxide film, a zirconium oxide film, a hafnium oxide film, a strontium oxide film, a titanium oxide film or the like may be deposited, respectively. Moreover, as the second reaction gas that oxidizes the above reaction gases, moisture vapor may be used instead of the $O_3$ gas. Furthermore, when obtaining a TiN film according to an embodiment of the present invention, where the oxidization gas is not used, a nitrogen containing gas such as ammonia (NH3) gas may be used as the second reaction gas supplied from the reaction gas nozzle 32 and the alteration gas supplied from the gas introduction nozzle 34.

In addition, while a case where the two reaction gases are used to form the reaction product is explained in the above examples, the present invention may be applied to a case where more than two reaction gases, for example, three or four reaction gases may be used to form a reaction product.

In addition, while the pair of the plasma generation members 80, 80 is provided in the above embodiment, two or more (e.g., three) pairs of the plasma generation members 80, 80 may be provided in other embodiments. Alternatively, only one plasma processing member 80, which includes the pair of the electrodes 36a, 36b, may be provided.

While the turntable 2 is rotated with respect to the gas supplying members (the nozzles 31, 32, 41, 42, and the plasma generation member 80) in each of the above examples, the gas supplying members may be rotated with respect to the turntable 2.

EXAMPLES

Next, experiments carried out to confirm an advantage of an embodiment of the present invention and the results are explained. Specifically, the experiments were carried out in order to investigate how the film properties are changed by the alteration step carried out in addition to the film deposition-alteration step, when the silicon oxide film is deposited. In addition, the step time ratios (T1:T2) were changed as listed in the following table in the experiments. Incidentally, the step times T1, T2 are listed in the table.

TABLE

|  | step time ratio (T1:T2) | step time T1 (second) | step time T2 (second) |
|---|---|---|---|
| Example 1 | 1:2 | 6 | 12 |
| Example 2 | 1:3 | 6 | 18 |

The film properties of the films obtained in the experiments were evaluated by applying a negative bias to the films and measuring a leakage current depending on the negative bias. In this evaluation, a lower leakage current indicates that the film becomes more densified and contains less of the impurities. Incidentally, the rotational speed was 20 rpm and other conditions are the same throughout the experiments.

Figure 12:
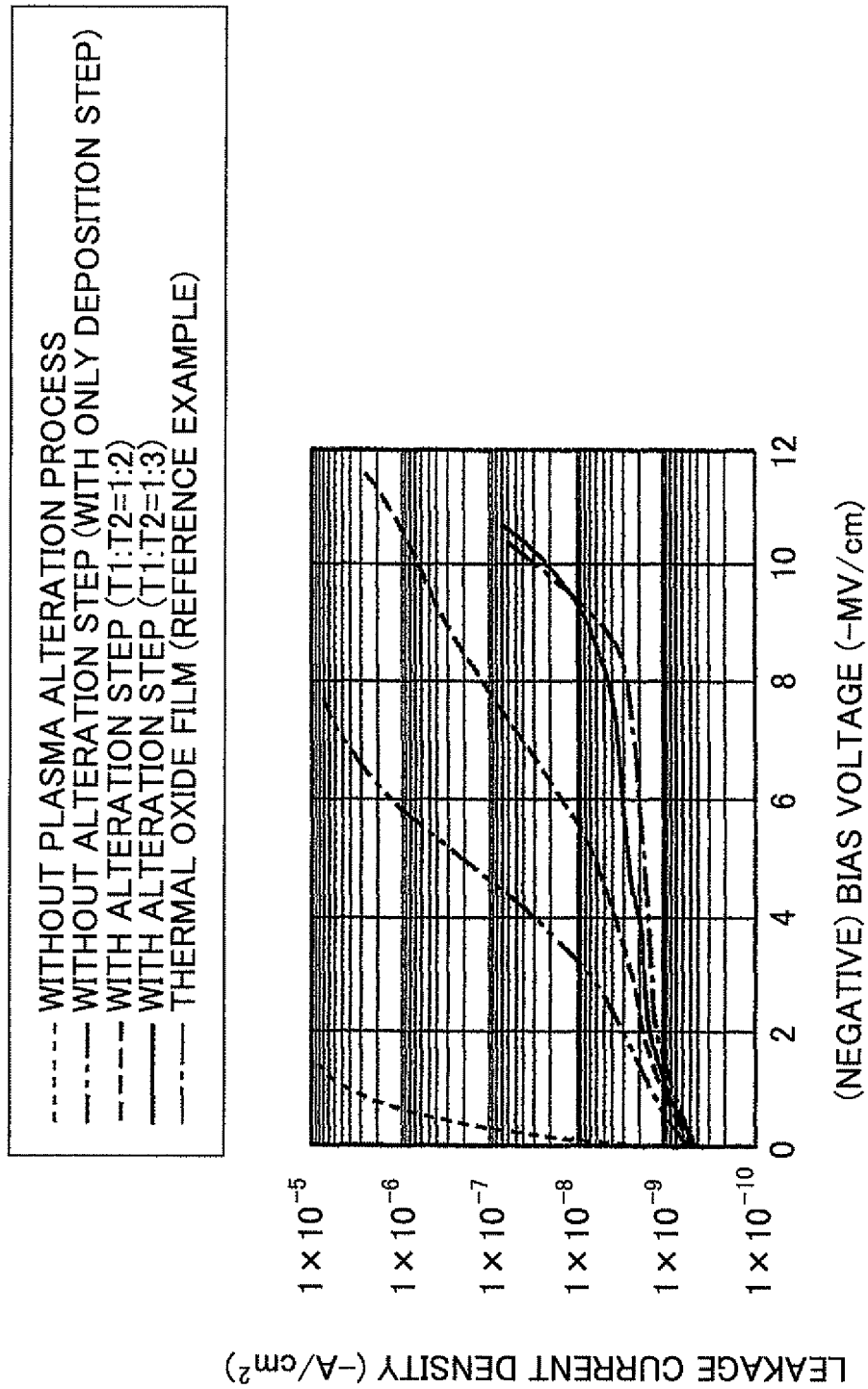
FIG. 12 is a graph illustrating results of experiments carried out in the film deposition apparatus of FIG. 1.

FIG. 12 is a graph illustrating the experiment results, which also illustrates results of a film obtained by carrying out only the film deposition-alteration step without the alteration step, a film obtained by carrying out only the film deposition process without any alteration processes, and a thermal silicon oxide film, as reference examples.

As shown in FIG. 12, by carrying out the alteration step along with the film deposition-alteration step, the film properties are improved compared to the case where the alteration step is not carried out and the case where no alteration processes are carried out. Especially, when the step time ratio T1/T2 is set to be 1/3, it is found that the film having excellent properties, which are comparable with those of the thermal silicon oxide, is obtained.

While the present invention has been described in reference to the foregoing embodiments, the present invention is not limited to the disclosed embodiments, but may be modified or altered within the scope of the accompanying claims.

What is claimed is:

1. A film deposition apparatus comprising:
a table that has a substrate receiving area on which a substrate is placed, the table being provided in a vacuum chamber;
a first reaction gas supplying portion that supplies a first reaction gas to be adsorbed on an upper surface of the substrate to the substrate receiving area;
a second reaction gas supplying portion that supplies a second reaction gas that reacts with the first reaction gas adsorbed on the upper surface of the substrate to form a reaction product to the substrate receiving area;
a plasma generation portion that activates an alteration gas into plasma so that an alteration process is carried out with respect to the reaction product on the substrate with the activated alteration gas;
a rotation mechanism that rotates the table relative to the first reaction gas supplying portion, the second reaction gas supplying portion, and the plasma generation portion; and
a control portion that outputs a control signal so that the film deposition apparatus is caused to perform at least once;
wherein the control portion outputs the control signal to the first reaction gas supplying portion, the second reaction gas supplying portion and further to the plasma generation portion to control a first nozzle of the first reaction gas supplying portion, a second nozzle of the second reaction gas supplying portion and an activated gas injector of the plasma generation portion such that the first reaction gas and the second reaction gas are alternatively supplied to the substrate respectively via the first and second gas nozzles that is then exposed to the alteration gas activated by the plasma and supplied via the activated gas injector,
wherein the control portion further outputs the control signal to the first reaction gas supplying portion, the second reaction gas supplying portion and further to the plasma generation portion to control the first nozzle of the first reaction gas supplying portion, the second nozzle of the second reaction gas supplying portion and the activated gas injector of the plasma generation portion such that the alteration gas activated by the plasma is supplied to the substrate via the activated gas injector in a state in which the first reaction gas is not supplied, and
wherein the control portion controls the first reaction gas supplying portion, the second reaction gas supplying portion and the plasma generation portion to perform a film deposition-alteration step by outputting the control signal to the first reaction gas supplying portion, the second reaction gas supplying portion and further to the plasma generation portion to control the first nozzle of the first reaction gas supplying portion, the second nozzle of the second reaction gas supplying portion and the activated gas injector of the plasma generation portion such that the first reaction gas and the second reaction gas are alternatively supplied to the substrate respectively via the first and second gas nozzles and such that the substrate is then exposed to the alteration gas activated by the plasma and supplied via the activated gas injector, and wherein the control portion further controls the first reaction gas supplying portion, the second reaction gas supplying portion and the plasma generation portion to perform an alteration step by outputting the control signal to the first reaction gas supplying portion, the second reaction gas supplying portion and further to the plasma generation portion to control the first nozzle of the first reaction gas supplying portion, the second nozzle of the second reaction gas supplying portion and the activated gas injector of the plasma generation portion such that the alteration gas activated by the plasma is supplied to the substrate via the activated gas injector in a state in which the first reaction gas is not supplied via the first gas nozzle, the control portion allows the second reaction gas to be supplied to the vacuum chamber via the second gas nozzle at the same flow rate between the film deposition-alteration step and the alteration step, in order to maintain the inside of the vacuum chamber at substantially an equal pressure between the film deposition-alteration step and the alteration step.

2. The film deposition apparatus of claim 1, wherein the control portion controls the first reaction gas supplying portion, the second reaction gas supplying portion and the plasma generation portion to perform a film deposition-alteration step by outputting the control signal to the first reaction gas supplying portion, the second reaction gas supplying portion and further to the plasma generation portion to control the first gas nozzle of the first reaction gas supplying portion, the second gas nozzle of the second reaction gas supplying portion and the activated gas injector of the plasma generation portion such that the first reaction gas and the second reaction gas are alternatively supplied to the substrate respectively via the first and second gas nozzles and such that the substrate is then exposed to the alteration gas activated by the plasma and supplied via the activated gas injector of the plasma generation portion, and wherein the control portion further controls the first reaction gas supplying portion, the second reaction gas supplying portion and the plasma generation portion to perform an alteration step by outputting the control signal to the first reaction gas supplying portion, the second reaction gas supplying portion and the plasma generation portion such that the alteration gas activated by the plasma is supplied to the substrate via the activated gas injector in a state in which the first reaction gas is not supplied via the first gas nozzle, the film deposition-alteration step and the alteration step are repeated plural times, and wherein the control portion controls the rotation mechanism so that the film deposition-alteration step and the alteration step are switched when the table is rotated n times, n being an integer.

3. The film deposition apparatus of claim 1, wherein the alteration gas is at least one of a noble gas and oxygen gas.

* * * * *